US012378953B2

(12) United States Patent
Lee (10) Patent No.: US 12,378,953 B2
(45) Date of Patent: Aug. 5, 2025

(54) APPARATUS AND METHOD FOR HARVESTING VIBRATION ENERGY FROM A ROTATING OBJECT (71) Applicant: UNIVERSITY OF MARYLAND, BALTIMORE COUNTY, Baltimore, MD (US)

(72) Inventor: Soobum Lee, Woodstock, MD (US)

(73) Assignee: UNIVERSITY OF MARYLAND, BALTIMORE COUNTY, Baltimore, MD (US)

( * ) Notice: Subject to any disclaimer, the term of this patent is extended or adjusted under 35 U.S.C. 154(b) by 0 days.

(21) Appl. No.: 18/354,165

(22) Filed: Jul. 18, 2023

(65) Prior Publication Data

US 2024/0011470 A1    Jan. 11, 2024

Related U.S. Application Data (62) Division of application No. 16/640,577, filed as application No. PCT/US2018/047505 on Aug. 22, 2018, now Pat. No. 11,725,637.

(Continued)

(51) Int. Cl.
| | |
|---|---|
| *F03G 7/08* | (2006.01) |
| *F03D 17/00* | (2016.01) |
| *H02K 7/18* | (2006.01) |
| *H02K 35/02* | (2006.01) |
| *H02N 2/18* | (2006.01) |

(Continued)

(52) U.S. Cl.
CPC ............... *F03G 7/08* (2013.01); *F03D 17/00* (2016.05); *H02K 7/1876* (2013.01); *H02K 35/02* (2013.01); *H02N 2/18* (2013.01); *H02N 2/181* (2013.01); *H02N 2/186* (2013.01); *H10N 30/02* (2023.02); *H10N 30/30* (2023.02); *H10N 30/306* (2023.02); *H10N 30/88* (2023.02); *F05B 2220/60* (2013.01); *F05B 2270/80* (2013.01)

(58) Field of Classification Search
CPC ........... F03G 7/08; F03D 17/00; H10N 30/02; H10N 30/30; H10N 30/306; H10N 30/88; H02K 7/1876; H02K 35/02; H02N 2/18; H02N 2/181; H02N 2/186; F05B 2220/60; F05B 2270/80
See application file for complete search history.

(56) References Cited

U.S. PATENT DOCUMENTS

| | | |
|---|---|---|
| 5,315,159 A | 5/1994 | Gribnau |
| 7,245,042 B1 | 7/2007 | Simnacher |

(Continued)

OTHER PUBLICATIONS

International Search Report, Jan. 15, 2019, International Application No. PCT/US18/047505.

(Continued)

*Primary Examiner* — Viet P Nguyen
(74) *Attorney, Agent, or Firm* — Casimir Jones, S.C.; Tristan A. Fuierer (57) ABSTRACT

Energy harvesters (EH) which can effectively harvest wasted vibrational/kinematic energy and convert it into electrical energy for battery-free sensor operation are described herein. The energy harvesters can be integrated with a power management circuit and a wireless sensor for monitoring wind turbine blades. The target application of the energy harvesters includes powering the wireless sensors used for wind turbine blade structural monitoring.

18 Claims, 6 Drawing Sheets

Related U.S. Application Data (60) Provisional application No. 62/677,825, filed on May 30, 2018, provisional application No. 62/548,492, filed on Aug. 22, 2017.

(51) Int. Cl.
*H10N 30/02* (2023.01)
*H10N 30/30* (2023.01)
*H10N 30/88* (2023.01)

(56) References Cited

U.S. PATENT DOCUMENTS

| | | | |
|---|---|---|---|
| 11,725,637 B2 | 8/2023 | Lee | |
| 2004/0061384 A1* | 4/2004 | Yatsuzuka | H02K 33/16 310/13 |
| 2005/0168307 A1 | 8/2005 | Reynolds et al. | |
| 2006/0157632 A1* | 7/2006 | Delson | H01F 7/1615 248/550 |
| 2007/0108770 A1* | 5/2007 | Riesberg | F03D 17/00 290/44 |
| 2011/0193350 A1 | 8/2011 | Rastegar et al. | |
| 2016/0319476 A1* | 11/2016 | Somma | H02K 1/34 |
| 2017/0141667 A1* | 5/2017 | Curry | H02K 35/02 |

OTHER PUBLICATIONS

World Wind Energy Association [Online]. Available: http://www.wwindea.org/.
20% Wind Energy by 2030—Increasing Wind Energy's Contribution to U.S. Electricity Supply, 2008.
Strategic Research Agenda—Market Deployment Strategy from 2008 to 2030 (European Wind Energy Technology Platform), 2008. [online]. Available: www.windplatform.eu.
C. A. Walford, Wind turbine reliability: understanding and minimizing wind turbine operation and maintenance costs: United States. Department of Energy, 2006.
C. Hatch, "Improved wind turbine condition monitoring using acceleration enveloping," Orbit, vol. 61, pp. 58-61, 2004. Can Not Locate Reference.
M. Wilkinson, F. Spianto, and M. Knowles, "Towards the zero maintenance wind turbine," in Universities Power Engineering Conference, 2006. UPEC'06. Proceedings of the 41st International, 2006, pp. 74-78.
D. McMillan and G. W. Ault, "Quantification of condition monitoring benefit for offshore wind turbines," Wind Engineering, vol. 31, pp. 267-285, 2007.
S. Priya and D. J. Inman, Energy harvesting technologies: Springer, 2008. Book. Abstract Only.
A. Erturk and D. J. Inman, Piezoelectric energy harvesting: John Wiley & Sons, 2011. Book. Abstract Only.
S. Lee, B. D. Youn, and B. C. Jung, "Robust segment-type energy harvester and its application to a wireless sensor," Smart Materials & Structures, vol. 18, p. 095021, 2009.
R. J. M. Vullers, R. V. Schaijk, H. J. Visser, J. Penders, and C. V. Hoof, "Energy harvesting for autonomous wireless sensor networks," Solid-State Circuits Magazine, IEEE, vol. 2, pp. 29-38. Abstract Only.
E. K. Reilly, L. M. Miller, R. Fain, and P. K. Wright, "A study of ambient vibrations for piezoelectric energy conversion," Proc. PowerMEMS 2009, pp. 312-315, 2009.
M. C. Reichenbach, "Evaluating vehicular-induced vibrations of typical highway bridges for energy harvesting applications," MS, The University of Texas at Austin, MS Thesis 2012.
T. V. Galchev, J. McCullagh, R. L. Peterson, and K. Najafi, "Harvesting traffic-induced vibrations for structural health monitoring of bridges," Journal of Micromechanics and Microengineering, vol. 21, pp. 104005, 2011.
H. J. Jung, Y. Song, S. K. Hong, C. H. Yang, S. J. Hwang, S. Y. Jeong, and T. H. Sung, "Design and optimization of piezoelectric impact-based micro wind energy harvester for wireless sensor network," Sensors and Actuators A: Physical vol. 222 pp. 314-321, 2015.
N. Chen, H. J. Jung, H. Jabbar, T. H. Sung, and W. Tingcun, "A piezoelectric impact-induced vibration cantilever energy harvester from speed bump with a low-power PMC", Sensors and Actuators A: Physical. vol. 254, pp. 134-144, 2017.
N. Chen, W. Tingcun, H. J. Jung, and S. Lee, "Quick self-start and minimum power-loss management circuit for impact-type micro wind piezoelectric energy harvesters," Sensors and Actuators A: Physical. vol. 263 pp. 23-29, 2017.
S Priya, C. T. Chen, D. Fye, and J. Zahnd, "Piezoelectric Windmill: A Novel Solution to Remote Sensing," Japanese Journal of Applied Physics, vol. 44, pp. L104-L107, 2006.
X. F. He and J. Gao, "Wind energy harvesting based on flow-induced-vibration and impact," Microelectronic Engineering, vol. 111, pp. 82-86, 2013.
Y. Kuang, T. Ruan, Z. J. Chew, M. Zhu, "Energy harvesting during human walking to power a wireless sensor node," Sensors and Actuators A: Physical. vol. 254 pp. 69-77, 2017.
Echo® Wireless Vibration Sensor [Online]. Available: http://www.pcb.com/products.aspx?m=670A01.
SAFT lithium-thionylchloride (LS 17500) [Online]. Available: file:///C:/Users/jung87/Downloads/LS17500_EN_31029-2-0615.5b7ffde6-a914-4e15-b631-c198c7c58c3b.pdf. **Cannot Locate Reference.
National Wind Watch [Online]. Available: https://www.wind-watch.org/faq-output.php.
Partnerships for renewables: Capacity Factor [Online]. Available: http://www.pfr.co.uk/pfr/3/Renewable-Energy/15/Wind-Power/119/Capacity-Factor/ Cannot Locate Reference.
Kong N, Dong S H, Erturk A and Inman D J, "Resistive impedance matching circuit for piezoelectric energy harvesting," Journal of Intelligent Material Systems and Structures, vol. 21, pp. 1293-1302, 2010. Abstract Only.

* cited by examiner

APPARATUS AND METHOD FOR HARVESTING VIBRATION ENERGY FROM A ROTATING OBJECT

CROSS REFERENCE TO RELATED APPLICATIONS

This application is filed under the provisions of 35 U.S.C. § 121 and claims priority to U.S. patent application Ser. No. 16/640,577 filed on Feb. 20, 2020, which was filed under the provisions of 35 U.S.C. § 371 and claims priority to International Patent application No. PCT/US2018/047505, filed on Aug. 22, 2018 in the name of Soobum LEE and entitled "Apparatus and Method for Harvesting Vibration Energy From a Rotating Object," which claims priority to U.S. Provisional Patent Application No. 62/548,492 filed on Aug. 22, 2017 in the name of Soobum Lee and entitled "Method for Harvesting Broadband Vibration Energy from a Rotating Object Using Asymmetric Nonlinear Spring" and U.S. Provisional Patent Application No. 62/677,825 filed on May 30, 2018 in the name of Soobum Lee and entitled "Dynamics of Vibration Energy Harvester Governed by Gravity and Magnetic Force in a Rotating Wind Turbine Blade," all of which are hereby incorporated by reference herein in their entirety.

FIELD

The present invention relates to an energy harvester apparatus and method of using same, wherein the apparatus can effectively harvest wasted vibrational/kinematic energy and convert it to electrical energy for battery-free structural sensor operation. The energy harvester apparatus can be used in a number of applications including, but not limited to, powering the wireless sensors used for wind turbine blade monitoring.

BACKGROUND OF THE INVENTION

Wind power has become the world's fastest growing renewable energy source. The worldwide wind power capacity now exceeds 120 GW [1]. The US targets 20% wind-based electricity generation by 2030 [2] and 25% of electricity generation by wind is envisioned in the European Union by 2020 [3]. Reducing the operation and maintenance (O&M) cost of wind turbines becomes a critical issue to make wind power competitive with conventional energy sources [4-7]. Wind turbines are hard-to-access structures, especially when they are remotely located (e.g., offshore), and this factor alone contributes to the high O&M cost. Also, the inspection labor is very costly because it is performed at high risk, greatly depends on the proficiency of the technician, and requires a huge crane. Most of the blades are currently inspected manually using a "tapping test"; the technician hammers blades lightly and hears the responding sound from them. Manual inspection requires turbine downtime which causes major economic loss [4, 5]. For a turbine with over 20 years of operating life, the estimated O&M is 10-15% of the total wind farm income [4] and it increases more than 25% for offshore wind turbines [6, 7]. Many researchers have actively pursued remote monitoring using wireless sensors, which has great potential to reduce the O&M cost. However, the power sustainability of wireless sensors has been an important issue because the sensors are powered by disposable batteries that require regular replacement [8, 9]. The extreme danger of battery replacement labor in a remote location results in high maintenance costs ($80-500 per one sensor's battery replacement) [10]. Moreover, it is almost impossible to access the inside of a wind turbine blade to replace battery.

Vibrational energy harvesting, a previous solution for a sustainable power supply, is problematic because it is too difficult to use random vibration in wind turbines. Commercial harvesters usually generate useful power only at their resonance frequency. Also, the random vibration causes time-variant impedance of the energy harvester and the corresponding complex charging circuit.

It would be an advance in the art to develop a maintenance-free and self-powering wireless sensor for wind turbine blade structural monitoring. The wireless sensor can fit inside of a wind turbine blade and thus no external wind energy would be required. Advantageously, the wireless sensor does not rely on disposable batteries but instead is self-generating, significantly reducing O&M costs.

SUMMARY OF THE INVENTION

In one aspect, an electromagnetic energy generation unit is described, said generation unit comprising at least one asymmetric spring, at least one nonlinear spring, at least one magnet, and a coil, wherein the at least one asymmetric spring connects the at least one magnet to a first location on a wall of the generation unit and the at least one nonlinear spring connects the at least one magnet to a second location on a wall of the generation unit, wherein the at least one magnet is supported within the generation unit by the at least one asymmetric spring and the at least one nonlinear spring, and wherein the coil is wound around the generation unit.

In another aspect, another electromagnetic energy generation unit is described, said generation unit comprising at least one asymmetric spring, at least one nonlinear spring, at least one magnet, and a coil, wherein the coil is wrapped around a nonmagnetic structure, wherein the at least one asymmetric spring connects the nonmagnetic structure to a first location on a wall of the generation unit and the at least one nonlinear spring connects the nonmagnetic structure to a second location on a wall of the generation unit, wherein the nonmagnetic structure is supported within the generation unit by the at least one asymmetric spring and the at least one nonlinear spring, and wherein the at least one magnet is supported on or around the generation unit.

In still another aspect, a piezoelectric energy harvester (PEH) is described, said PEH comprising a gravity-induced rotator and a piezoelectric cantilever beam, wherein said gravity-induced rotator comprises an impact bar, a weighted mass and a bearing, and the cantilever beam comprises a fixed end and a cantilever tip, wherein during every rotation of the rotator, the impact bar exerts a force on the cantilever tip such that the cantilever beam vibrates and generates electrical energy.

In yet another aspect, another piezoelectric energy harvester (PEH) is described, said PEH comprising a gravity-induced rotator and a piezoelectric cantilever beam, wherein said gravity-induced rotator comprises a first magnet, optionally a weighted mass, and a bearing, and the cantilever beam comprises a fixed end and a cantilever tip, wherein the cantilever tip comprises a second magnet, wherein during every rotation of the rotator, the first magnet exerts a force on the second magnet on the cantilever tip such that the cantilever beam vibrates and generates electrical energy.

In another aspect, a method of generating sustainable electrical energy is described, said method comprising harvesting the energy from a rotating object and converting it to electrical energy, said method comprising positioning an electromagnetic energy generation unit as described herein in or on a rotating object, and connecting the electromagnetic energy generation unit to a power management circuit and a storage unit, wherein the vibrational/kinematic energy of the rotating object is converted to sustainable battery-free electrical energy.

In still another aspect, another method of generating sustainable electrical energy is described, said method comprising harvesting the energy from a rotating object and converting it to electrical energy, said method comprising positioning the impact-driven energy harvester as described herein in or on a rotating object, and connecting the impact-driven energy harvester to a power management circuit and a storage unit, wherein the vibrational/kinematic energy of the rotating object is converted to sustainable battery-free electrical energy.

Other aspects, features and embodiments of the invention will be more fully apparent from the ensuing disclosure and appended claims.

BRIEF DESCRIPTION OF THE FIGURES

FIG. 4(a) illustrates the principle of high-energy vibration using asymmetric nonlinear spring assembly, wherein FIG. 4(a) illustrates the static configuration.

FIG. 4(b) illustrates the principle of high-energy vibration using asymmetric nonlinear spring assembly, wherein FIG. 4(b) illustrates a reaction force on the assembly of FIG. 4(a).

FIG. 4(c) illustrates the principle of high-energy vibration using asymmetric nonlinear spring assembly, wherein FIG. 4(c) illustrates the snapping behavior of FIG. 4(a).

DETAILED DESCRIPTION, AND PREFERRED EMBODIMENTS THEREOF

Practical energy harvesters (EH) are described herein, which can effectively harvest wasted vibrational/kinematic energy and convert it to electrical energy for battery-free structural sensor operation. The target application of the energy harvesters includes, but is not limited to, powering the wireless sensors used for wind turbine blade monitoring. The power sustainability of wireless sensors has been an important issue because the sensors powered by disposable batteries have a limited life, and their replacement is expensive and difficult due to the extreme danger of replacement in remote locations. The energy harvesters described herein include an integrated power management circuit and a wireless sensor for monitoring wind turbine blades with the target specifications: (i) average power greater than 3 mW based on the typical rotational speed of wind turbine, (ii) useful life for more than 10 years, and (iii) volume less than 30 cm$^3$.

Figure 1:
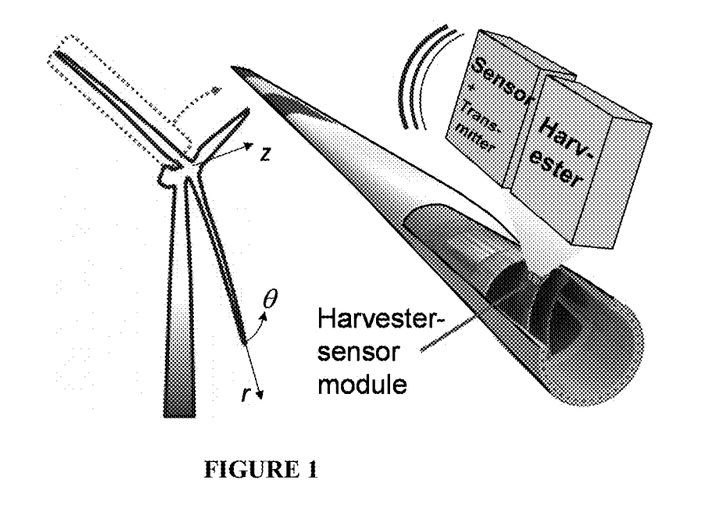
FIG. 1 is an illustration of the proposed energy harvester mounted on or in a wind turbine blade comprising a sensor and a transmitter.

In a first aspect of the invention, a coil and magnet unit generator is placed on or in a rotating object, such as a wind turbine blade (see, FIG. 1), and captures the rotational energy, converting it into electrical energy. The coil and magnet unit includes a snap-through mechanism (e.g., a nonlinear spring) that supports the magnet (or the coil) to harvest vibrational energy from varied rotational speed (or broad frequency range). When the object rotates, its tangential (or radial) acceleration component excites the coil/magnet unit, and the relative motion between the magnet and the coil generates electrical energy by electromagnetic energy induction. The switching gravitational acceleration along the radial direction triggers the snapping of the nonlinear spring, which is helped by its asymmetric characteristic, and the snapping behavior effectively amplifies energy generation from a varied rotational speed. The generator of the first aspect can be used to supply power to a blade structural monitoring system from a variable blade rotating speed, thereby eliminating the necessity of a battery.

Figure 2A:
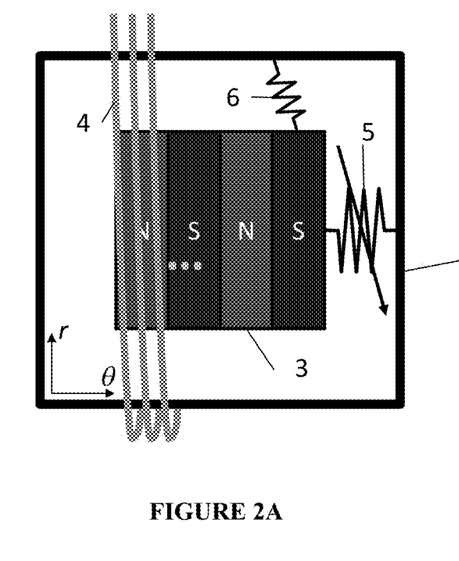
FIG. 2(a) is a schematic of power generation unit of the first aspect of the invention.
Figure 2B:
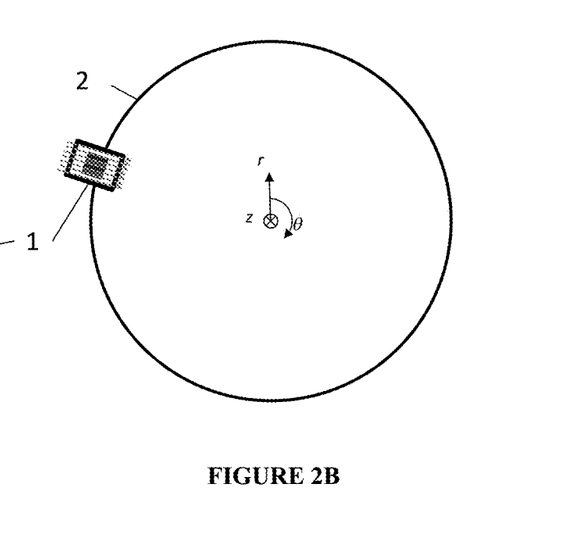
FIG. 2(b) is a schematic of the alignment of the power generation unit of FIG. 2(a) on a rotating object.

The basic operation scheme of the first aspect of the invention is displayed in FIG. 2. A magnet/coil unit (1) is located on or in a rotating object (2, or for example a blade) (see, FIG. 2(b)) and connected to an electrical application which requires electrical power supply, such as a sensor. The embodiment in FIG. 2(a) shows a permanent magnet (3) supported by a nonlinear spring (5) wherein asymmetric spring characteristic is realized (6). Either a permanent magnet and/or a coil unit can be supported by asymmetric nonlinear spring assembly. The nonlinear spring (5) is aligned so that the magnet transverses along tangential direction (θ). The asymmetric characteristic (6), embodied to respond to radial direction acceleration (r), triggers snapping behavior and high-energy vibration of the nonlinear spring (5). The frequency range of high-energy vibration is broad, so the power generation from varied rotational speed (or broadband frequency vibration) is enabled. In the embodiment of FIG. 2(a), the coil (4) is wound around the unit, and electrical current is generated in the coil unit according to Fleming's right-hand rule. The locations of coil and the magnet can be switched, for example, by replacing the magnet with a nonmagnetic normal structure (e.g., wooden block) that is wound by coil, and the magnet is attached around the support. The asymmetric vibration system effectively triggers high-energy vibration (with snapping) by gravitational acceleration change. The generation unit can be connected to a power management circuit and storage unit (e.g., a supercapacitor), which can thereby supply sustainable electrical energy to a wireless sensor with no battery replacement.

Figure 3:
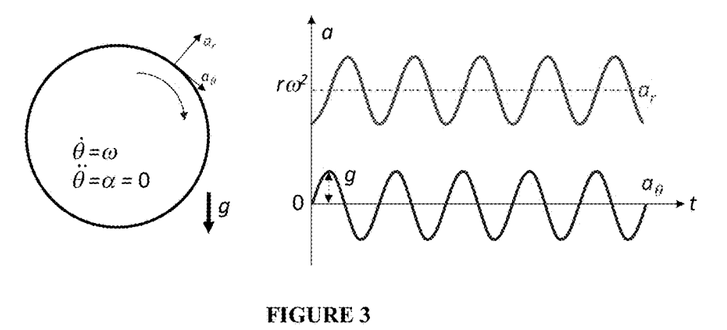
FIG. 3 illustrates the acceleration components in a rotating body in gravitational field when the angular acceleration is assumed to be zero.

FIG. 3 illustrates the acceleration components in a rotating body in a gravitational field when a constant angular velocity ($\omega$) is assumed. Both radial ($a_r$) and tangential ($a_\theta$) components vary sinusoidally as gravitational acceleration switches in one rotational cycle, referenced at $r\omega^2$ and 0, respectively. Also the phase is different by 90 degrees. The invention of the first aspect uses a go stimulate high-energy vibration of a nonlinear spring vibration system.

Figure 4A:
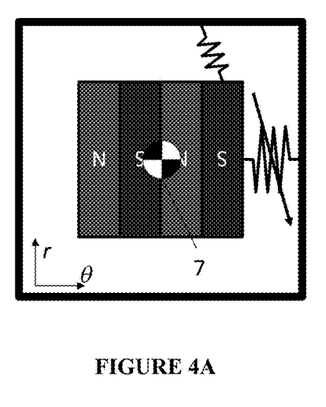
Figure 4B:
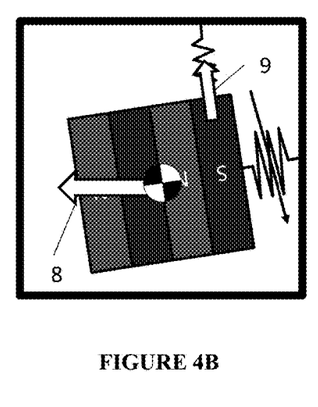
Figure 4C:
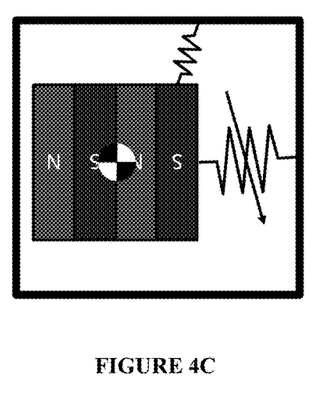

The details of the nonlinear vibration is explained in FIGS. 4(a)-(c). It is noted that the coil is not shown to focus the attention on the movement of the magnet and the springs. Starting with the static configuration shown in FIG. 4(a), when there is a change of tangential acceleration component, inertial force (8) acting on the center of gravity of magnet (7) and the reaction force on the asymmetric spring (9) produces torque and "tilting" motion (FIG. 4(b)), and it triggers snapping behavior of the nonlinear spring (FIG. 4(c)). The vibration from FIG. 4(a) to FIG. 4(c) is referred to as high-energy vibration which is beneficial for broadband vibration energy harvesting. To summarize, the asymmetric nonlinear characteristic enables effective broadband power generation.

Figure 5A:
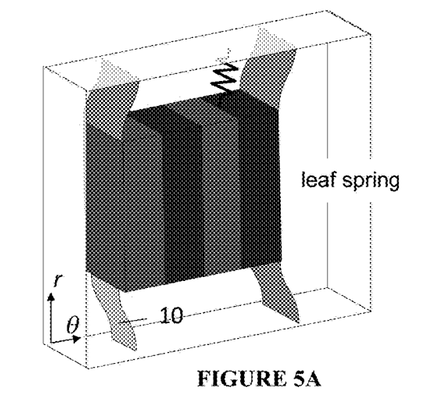
FIG. 5(a) is a perspective view of the embodiment with multiple leaf springs and one linear spring that is less stiff than the others.
Figure 5B:
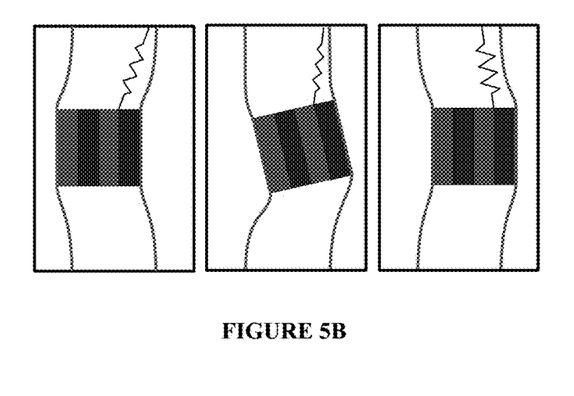
FIG. 5(b) illustrates the transition of the asymmetric nonlinear spring of FIG. 5(a) in high-energy vibration.

One embodiment of the unit of the first aspect with asymmetric nonlinear spring is shown in FIG. 5. FIG. 5(a) is perspective view of the embodiment with multiple leaf springs one of which (10) is less stiff than the others. In this embodiment nonlinearity is realized by the leaf springs and the asymmetry is characterized by one weaker spring. Although the leaf springs are shown having a specific curvature in FIG. 5, the shape is not limited to that shown, as understood by the person skilled in the art. It should also be appreciated that although a total of four leaf springs are illustrated in FIG. 5(a), one of which is less stiff than the other three, the unit can comprise more or less than four total leaf springs (e.g., 2, 3, 4, 5, 6, 7, 8, 9, 10, or more) and/or more than one leaf spring that is less stiff than the others, as readily determined by the person skilled in the art. FIG. 5(b) shows the transition of the asymmetric nonlinear spring of FIG. 5(a) in high-energy vibration.

Figure 6A:
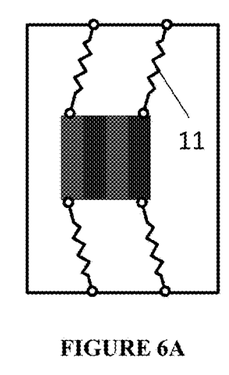
FIG. 6(a) illustrates an alternative embodiment for nonlinearity of spring stiffness comprising coil springs.
Figure 6B:
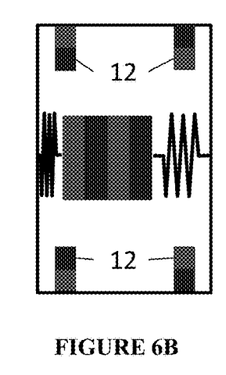
FIG. 6(b) illustrates an alternative embodiment for nonlinearity of spring stiffness comprising additional peripheral magnets.

FIG. 6 shows two additional embodiments of the unit of the first aspect for nonlinearity of spring stiffness using: coil springs (11, FIG. 6(a)) or additional peripheral magnets (12, FIG. 6(b)). Both layouts realize two local equilibrium positions where low-energy vibration occurs. High-energy vibration is generated when the central block (magnet in this figure) moves between these two equilibrium positions. In both cases, asymmetry can be realized by different spring constant and different magnetic force, respectively. In FIG. 6(b), a magnet-attractive material can be used instead of the peripheral magnets (12).

In the first aspect of the invention, an electromagnetic energy generation unit is disclosed, said generation unit comprising at least one asymmetric spring, at least one nonlinear spring, at least one magnet, and a coil, wherein the at least one asymmetric spring connects the at least one magnet to a first location on a wall of the generation unit and the at least one nonlinear spring connects the at least one magnet to a second location on a wall of the generation unit, wherein the at least one magnet is supported within the generation unit by the at least one asymmetric spring and the at least one nonlinear spring, and wherein the coil is wound around the generation unit. The coil can optionally be supported by an asymmetric nonlinear spring assembly. Alternatively, the electromagnetic energy generation unit comprises at least one asymmetric spring, at least one nonlinear spring, at least one magnet, and a coil, wherein the coil is wrapped around a nonmagnetic structure, wherein the at least one asymmetric spring connects the nonmagnetic structure to a first location on a wall of the generation unit and the at least one nonlinear spring connects the nonmagnetic structure to a second location on a wall of the generation unit, wherein the nonmagnetic structure is supported within the generation unit by the at least one asymmetric spring and the at least one nonlinear spring, and wherein the at least one magnet is supported on or around the generation unit. The generation unit can be placed in or on a rotating object, such as a wind turbine blade. The generation unit is connected to an electrical application which requires electrical power, such as a sensor. Tangential acceleration excites the generation unit and this vibration induces relative motion between the at least one magnet and the coil, at least one of which is supported by a nonlinear spring. The nonlinear springs' high-energy vibration (or snapping behavior) is triggered by the asymmetric spring component which responds to the change of gravitational force along tangential direction. This high-energy vibration can utilize broadband frequency (or varied rotational speed) and realize high-efficiency energy generation. The generation unit can be connected to a power management circuit and storage unit (e.g., a supercapacitor), which can thereby supply sustainable electrical energy to a device that requires electrical energy.

Alternatively, the electromagnetic energy generation unit comprises at least one asymmetric spring, at least one nonlinear spring, at least one magnet, and a coil, wherein the coil is wrapped around a nonmagnetic structure, wherein the at least one asymmetric spring connects the nonmagnetic structure to a first location on a wall of the generation unit and the at least one nonlinear spring connects the nonmagnetic structure to a second location on a wall of the generation unit, wherein the nonmagnetic structure is supported within the generation unit by the at least one asymmetric spring and the at least one nonlinear spring, and wherein the at least one magnet is supported on or around the generation unit. The generation unit can be placed in or on a rotating object, such as a wind turbine blade. The generation unit is connected to an electrical application which requires electrical power, such as a sensor. Tangential acceleration excites the generation unit and this vibration induces relative motion between the at least one magnet and the coil, at least one of which is supported by a nonlinear spring. The nonlinear springs' high-energy vibration (or snapping behavior) is triggered by the asymmetric spring component which responds to the change of gravitational force along tangential direction. This high-energy vibration can utilize broadband frequency (or varied rotational speed) and realize high-efficiency energy generation. The generation unit can be connected to a power management circuit and storage unit (e.g., a supercapacitor), which can thereby supply sustainable electrical energy to a device that requires electrical energy.

An embodiment of the electromagnetic energy generation unit of the first aspect comprises a wind turbine blade having the electromagnetic energy generation unit contained in or on said blade. The generation unit can be connected to a power management circuit and storage unit (e.g., a supercapacitor), which can thereby supply sustainable electrical energy to a device that requires electrical energy, as readily understood by the person skilled in the art.

Figure 7A:
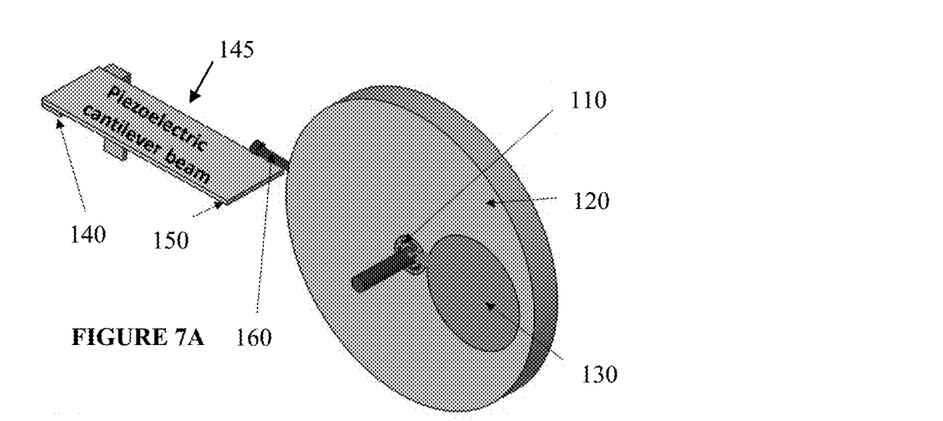
FIG. 7(a) illustrates an impact-based energy harvester of the second aspect of the invention.
Figure 7B:
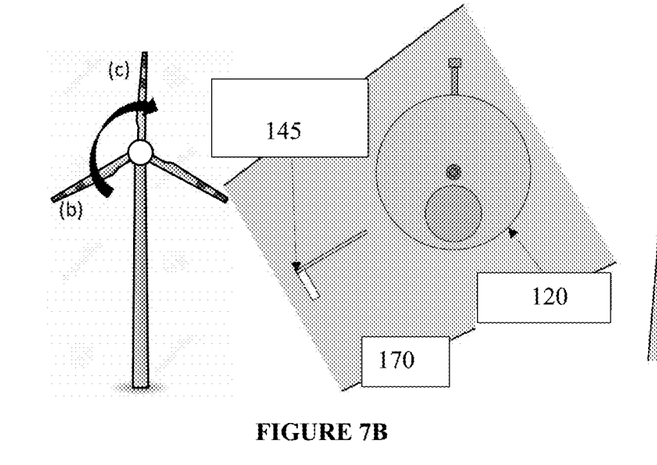
FIG. 7(b) illustrates the attachment of the energy harvester of FIG. 7(a) positioned on a rotating object (e.g., a wind turbine blade).
Figure 7C:
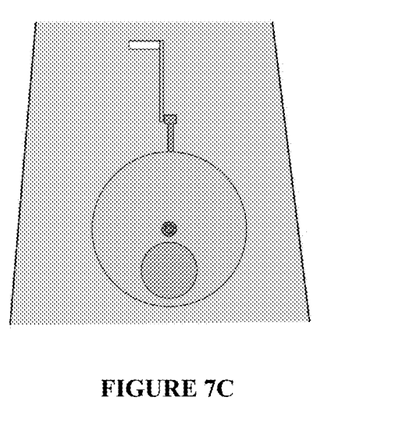
FIG. 7(c) illustrates the general movement of the energy harvester with the movement of the rotating object.

In a second aspect, an impact-driven energy harvester that can efficiently generate energy regardless of the rotational speed of a rotating object, e.g., a wind turbine, is disclosed. The impact-driven energy harvester comprises a piezoelectric cantilever that is excited at its free tip by the gravity-induced rotator to generate vibration (see, FIG. 7, which will be described in more detail below). Piezoelectric energy harvesters (PEHs) scavenge widely available wasted vibrational energy and reuse it for small electronic operations such as for wireless sensors (e.g., automation sensors, monitoring sensors) [11-14]. Advantageously, impact-driven harvesting devices with simplified power management circuits [15-20], can generate substantial output power exceeding that produced by vibration commercial harvesters.

The gravity-induced rotator is used to strike the piezoelectric cantilever beam (145). The gravity-induced rotator (120) comprising an impact bar (160), a weighted mass (130), and a bearing (110) as shown in FIG. 7(a). It can be seen that the impact bar sweeps a larger radius than the rotator. An example of the placement of the gravity-induced rotator on (or within) a blade (170) as well as the normal operation of the wind turbine (a ⅓ cycle) is shown in FIG. 7(b-c). The orientation of the gravity-induced rotator remains fixed in a global coordinate system (defined on the earth) while the orientation of the cantilever changes. The cantilever beam (145) has a fixed end (140) and a cantilever tip (150). At every rotation cycle, the cantilever tip (150) is excited by the impact bar (160) to cause vibration. As defined herein, "excited by," corresponds to actual contact between the cantilever tip and the impact bar or alternatively, an attractive/repulsive force, such as a magnetic force, experienced between the cantilever tip and the impact bar or between two magnets, one of which is on the cantilever tip. For any rotation speed of wind turbine, the piezoelectric cantilever beam (145) generates electrical energy at the PEH's natural frequency which results in a fixed electrical impedance. This fixed impedance dramatically simplifies the charging circuit because the optimum impedance load does not need to be tracked. Also, power dissipation and the size of the circuit for PEH can be significantly reduced. Advantageously, the operation at the natural frequency of the PEH, regardless of actual wind turbine operational conditions, produces sufficient power output for sensor operation. The energy harvester can be connected to a power management circuit and storage unit (e.g., a supercapacitor), which can thereby supply sustainable electrical energy to a wireless sensor with no battery replacement.

Figures 9A, 9B:
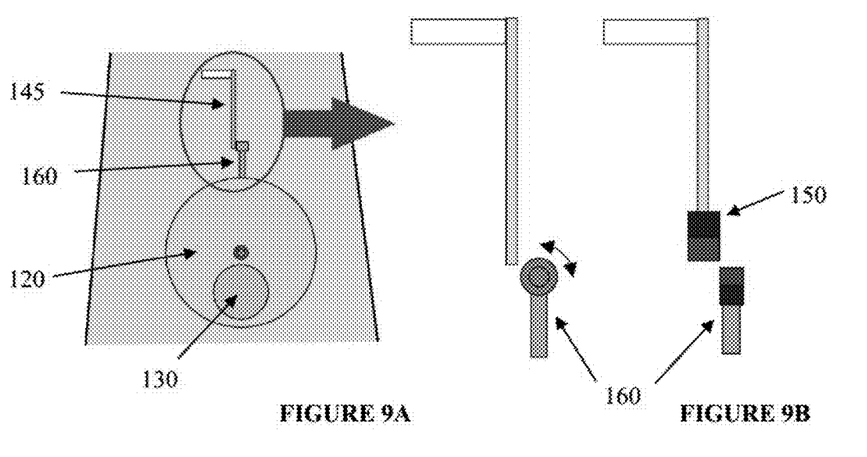
FIG. 9(a) illustrates an alternative impact bar design comprising a roller.
FIG. 9(b) illustrates an alternative impact bar and cantilever tip design each comprising a magnet.

The gravity-induced rotator of the second aspect can be on or in the blade of the wind turbine or other rotating object. The detailed design specification such as cantilever beam shape and circuit components can be readily determined by the person skilled in the art using design optimization techniques. For example, a cantilever beam can comprise lead zirconate titanate (PZT) materials laminated as a patch on both sides of a shim, for example a shim comprising blue steel. To reduce the material deterioration, the piezoelectric cantilever can be entirely encased within an external shell or case that protects the piezoelectric harvester from the outdoor environment. This layered structure will protect the piezoelectric material and improve the structural durability. The cantilever beam can further comprise a weight or other configuration on the tip end (150). For example, alternative tip and impact bar designs are shown in FIGS. 9(a-b). In FIG. 9(a), a rolling impactor is illustrated while in FIG. 9(b), a magnet is attached to both the impactor and a cantilever beam. In the case of FIG. 9(b), the magnetic repelling force is nonlinear. At every rotation cycle, the cantilever tip (150) is excited by the impact bar (160) to cause vibration.

Figure 10A:
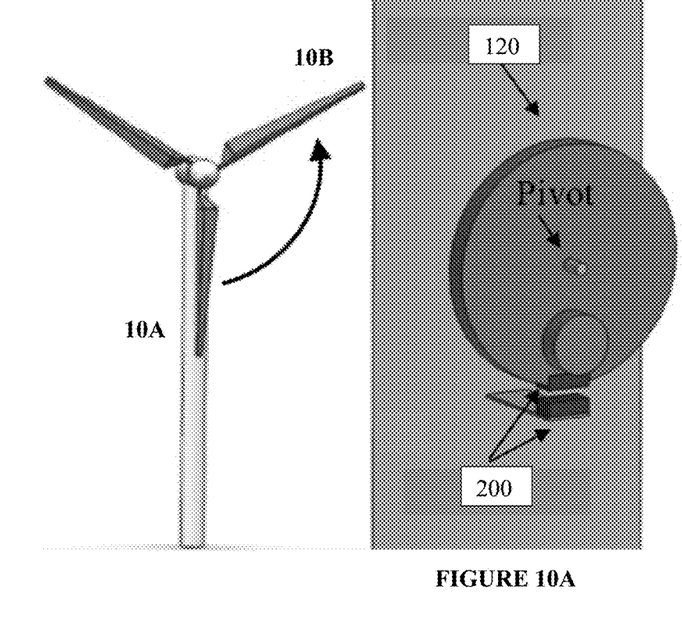
FIG. 10(a) illustrates an alternative rotary disk and cantilever beam-PZT in a vertical position.
Figure 10B:
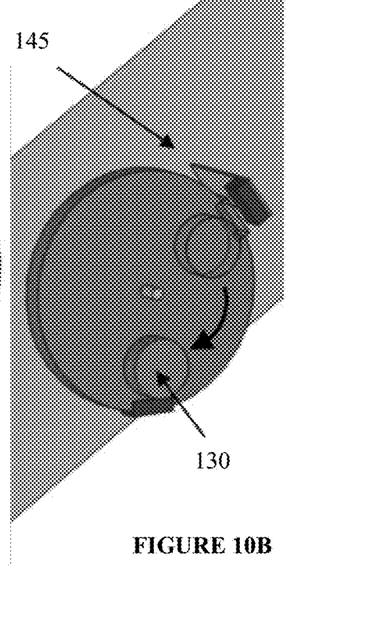
FIG. 10(b) illustrates the alternative rotary disk and cantilever beam-PZT of FIG. 10(a) in an inclined position.

An alternative embodiment of the magnetic gravity-induced rotator is shown in FIG. 10, illustrating a first magnet (200) on the tip of the cantilever beam (145) and a second magnet (200) positioned on the gravity-induced rotator (120). It is noted that in the unit of FIG. 10, there is no impact beam but instead the magnet is positioned directly on the gravity-induced rotator. Because the second magnet is positioned directly on the gravity-induced rotator, the mass (130) is optional, assuming the second magnet has a mass that is substantial enough to maintain the orientation of the gravity-induced rotator as described hereinabove. In other words, in one embodiment, the second magnet provides enough weight that the mass (130) is unnecessary. In another embodiment, the mass (130) and the second magnet are present on the gravity-induced rotator. At every rotation cycle, the first magnet is excited by the second magnet to cause vibration.

An embodiment of the impact-driven energy harvester of the second aspect comprises a wind turbine blade having the impact-driven energy harvester contained in or on said blade. The energy harvester can be connected to a power management circuit and storage unit (e.g., a supercapacitor), which can thereby supply sustainable electrical energy to a device that requires electrical energy, as readily understood by the person skilled in the art.

The piezoelectric cantilever beam of the second aspect vibrates at its natural resonance frequency regardless of wind turbine rotational speed, which results in a fixed electrical impedance to enable a highly efficient and simplified charging circuit. This is an advantage over the prior art linear piezoelectric energy harvesters, whose working frequency is limited. In contrast, the piezoelectric energy harvester of the second aspect can work under a varied rotational speed.

In a third aspect, a method of generating sustainable electrical energy is described, said method comprising harvesting the energy from a rotating object and converting it to electrical energy, said method comprising positioning the electromagnetic energy generation unit of the first aspect in or on a rotating object, and connecting the electromagnetic energy generation unit to a power management circuit and a storage unit, wherein the vibrational/kinematic energy of the rotating object is converted to sustainable battery-free electrical energy. In one embodiment, the rotating object is a blade, for example, a wind turbine blade and the sustainable battery-free electrical energy is needed to operate a structural sensor.

In a fourth aspect, a method of generating sustainable electrical energy is described, said method comprising harvesting the energy from a rotating object and converting it to electrical energy, said method comprising positioning the impact-driven energy harvester of the second aspect in or on a rotating object, and connecting the impact-driven energy harvester to a power management circuit and a storage unit, wherein the vibrational/kinematic energy of the rotating object is converted to sustainable battery-free electrical energy. In one embodiment, the rotating object is a blade, for example, a wind turbine blade and the sustainable battery-free electrical energy is needed to operate a structural sensor.

Overall, a piezoelectric harvesting system has the advantage of being lightweight and thus does not affect the aerodynamics of the wind turbine blade.

Example 1

Figure 8A:
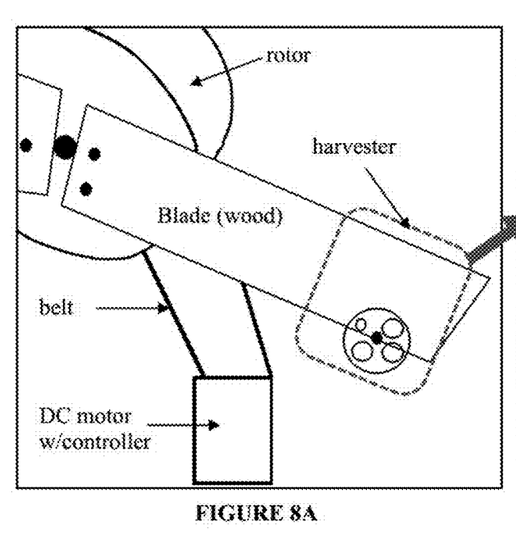
FIG. 8(a) is a photograph of a wind turbine blade simulation carried out in the laboratory.
Figure 8B:
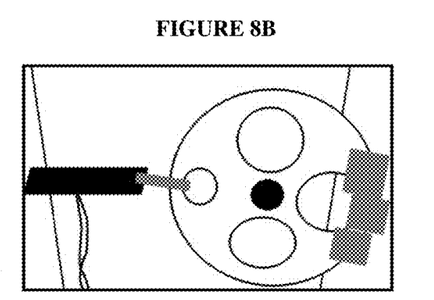
FIG. 8(b) is a photograph of a first prototype of the proposed PEH mounted on the blade shown in FIG. 8(a).
Figure 8C:
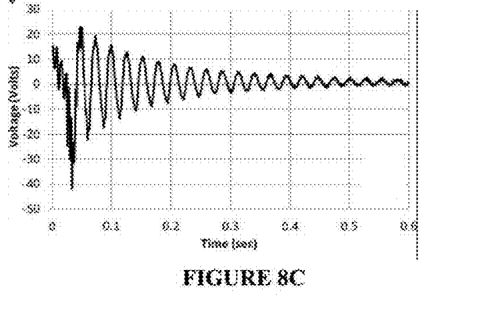
FIG. 8(c) is the output voltage of the PEH of FIG. 8(b) at the optimum load.

A preliminary study of the impact-driven PEH with gravity-induced rotator was conducted recently. The performance of the impact-driven PEH was experimentally verified as shown in FIG. 8(a-b). The testing setup comprised am energy harvester mounted on a wooden blade (about 50 cm long), a DC motor, and the data acquisition system. The average power was 2.34 mW at the optimum resistive load, as shown in FIG. 8(c).

Based on the energy consumption level of a commercial wireless vibration sensor (670A01, PCB Piezotronics Inc.) for monitoring the wind turbine [21, 22], the energy consumption per day of wireless vibration sensor is 32.5 J. Considering the capacity factor (25%) of the wind turbine [23, 24] and the circuit efficiency (70%) [25], the preliminary experiment showed that the energy generation per day of the PEH was 35.5 J (=2.34 mW×24 h×25%×70%). Therefore, this example has shown that the PEH can supply enough power to the wireless sensor for monitoring wind turbines.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

REFERENCES

[1] World Wind Energy Association [Online]. Available: www dot wwindea dot org.

[2] "20% Wind Energy by 2030—Increasing Wind Energy's Contribution to U.S. Electricity Supply (US DOE/GO-102008-2567)," 2008.

[3] "Strategic Research Agenda—Market Deployment Strategy from 2008 to 2030 (European Wind Energy Technology Platform)," 2008.

[4] C. A. Walford, *Wind turbine reliability: understanding and minimizing wind turbine operation and maintenance costs*: United States. Department of Energy, 2006.

[5] C. Hatch, "Improved wind turbine condition monitoring using acceleration enveloping," *Orbit*, vol. 61, pp. 58-61, 2004.

[6] M. Wilkinson, F. Spianto, and M. Knowles, "Towards the zero maintenance wind turbine," in *Universities Power Engineering Conference, 2006. UPEC'06. Proceedings of the 41st International*, 2006, pp. 74-78.

[7] D. McMillan and G. W. Ault, "Quantification of condition monitoring benefit for offshore wind turbines," *Wind Engineering*, vol. 31, pp. 267-285, 2007.

[8] S. Priya and D J Inman, *Energy harvesting technologies*: Springer, 2008.

[9] A. Erturk and D J Inman, *Piezoelectric energy harvesting*: John Wiley & Sons, 2011.

[10] S. Lee, B. D. Youn, and B. C. Jung, "Robust segment-type energy harvester and its application to a wireless sensor," *Smart Materials & Structures*, vol. 18, p. 095021, 2009.

[11] R. J. M. Vullers, R. V. Schaijk, H. J. Visser, J. Penders, and C. V. Hoof, "Energy harvesting for autonomous wireless sensor networks," *Solid-State Circuits Magazine, IEEE*, vol. 2, pp. 29-38.

[12] E. K. Reilly, L. M. Miller, R. Fain, and P. K. Wright, "A study of ambient vibrations for piezoelectric energy conversion," *Proc. PowerMEMS* 2009, pp. 312-5, 2009.

[13] M. C. Reichenbach, "Evaluating vehicular-induced vibrations of typical highway bridges for energy harvesting applications," MS, The University of Texas at Austin, MS Thesis 2012.

[14] T. V. Galchev, J. McCullagh, R. L. Peterson, and K. Najafi, "Harvesting traffic-induced vibrations for structural health monitoring of bridges," *Journal of Micromechanics and Microengineering*, vol. 21, pp. 104005, 2011.

[15] H. J. Jung, Y. Song, S. K. Hong, C. H. Yang, S. J. Hwang, S. Y. Jeong, and T. H. Sung, "Design and optimization of piezoelectric impact-based micro wind energy harvester for wireless sensor network," *Sensors and Actuators A: Physical* vol. 222 pp. 314-321, 2015.

[16] N. Chen, H. J. Jung, H. Jabbar, T. H. Sung, and W. Tingcun, "A piezoelectric impact-induced vibration cantilever energy harvester from speed bump with a low-power PMC", *Sensors and Actuators A: Physical*. vol. 254, pp. 134-144, 2017.

[17] N. Chen, W. Tingcun, H. J. Jung, and S. Lee, "Quick self-start and minimum power-loss management circuit for impact-type micro wind piezoelectric energy harvesters," *Sensors and Actuators A: Physical*. vol. 263 pp. 23-29, 2017.

[18] S Priya, C. T. CHEN, D. Fye, and J. Zahnd, "Piezoelectric Windmill: A Novel Solution to Remote Sensing," *Japanese Journal of Applied Physics*, vol. 44, pp. L104-L107, 2006.

[19] X. F. He and J. Gao, "Wind energy harvesting based on flow-induced-vibration and impact," *Microelectronic Engineering*, vol. 111, pp. 82-86, 2013.

[20] Y. Kuang, T. Ruan, Z. J. Chew, M. Zhu, "Energy harvesting during human walking to power a wireless sensor node," *Sensors and Actuators A: Physical*. vol. 254 pp. 69-77, 2017.

[21] Echo® Wireless Vibration Sensor [Online]. Available: http://www.pcb.com/products. aspx?m=670A01.

[22] SAFT lithium-thionylchloride (LS 17500) [Online]. Available: file:///C:/Users/jung87/Downloads/LS17500_EN_31029-2-0615.5b7ffde6-a914-4e15-b631-c198c7c58c3b.pdf.

[23] National Wind Watch [Online]. Available: https://www-.wind-watch.org/faq-output.php

[24] Partnerships for renewables: Capacity Factor [Online]. Available: http://www.pfr.co.uk/pfr/3/Renewable-Energy/15/Wind-Power/119/Capacity-Factor/

[25] Kong N, Dong S H, Erturk A and Inman D J, "Resistive impedance matching circuit for piezoelectric energy harvesting," *Journal of Intelligent Material Systems and Structures* vol. 21, pp. 1293-1302 2010.

What is claimed is:

1. An electromagnetic energy generation unit comprising at least one asymmetric spring, at least one nonlinear spring, at least one magnet, and a coil, wherein the at least one asymmetric spring connects the at least one magnet to a first wall of the generation unit and responds to radial direction acceleration (r) of the at least one magnet within the generation unit, wherein the at least one nonlinear spring connects the at least one magnet to a second wall of the generation unit and is aligned so that the at least one magnet transverses along a tangential direction (θ) within the generation unit, wherein the at least one magnet is supported within the generation unit by the at least one asymmetric spring and the at least one nonlinear spring, wherein the coil is wound around the generation unit, wherein asymmetry of the at least one asymmetric spring is realized by (a) the generation unit having the first and second walls approximately 90° relative to one another or (b) the at least one asymmetric spring having a different spring constant than other springs in the generation unit, and wherein the generation unit is placed in or on a rotating object and with a change of tangential acceleration, inertial force acting on a center of gravity of the at least one magnet and a reaction force on the at least one asymmetric spring produces torque and triggers snapping behavior of the nonlinear spring.

2. The generation unit of claim 1, wherein the rotating object is a wind turbine blade.

3. The generation unit of claim 1, wherein the generation unit is connected to a power management circuit and storage unit.

4. The generation unit of claim 1, wherein the generation unit is connected to an electrical application which requires electrical power.

5. The generation unit of claim 4, wherein the electrical application is a sensor.

6. The generation unit of claim 1, wherein the at least one nonlinear spring is a leaf spring.

7. The generation unit of claim 1, wherein the triggered snapping behavior triggers high-energy vibration of the at least one magnet.

8. The generation unit of claim 7, wherein the high-energy vibration is broadband frequency vibration.

9. A method of generating sustainable electrical energy, said method comprising harvesting the energy from a rotating object and converting it to electrical energy, said method comprising positioning the electromagnetic energy generation unit of claim 1 in or on a rotating object, and connecting the electromagnetic energy generation unit to a power management circuit and a storage unit, wherein the vibrational/kinematic energy of the rotating object is converted to sustainable battery-free electrical energy.

10. An electromagnetic energy generation unit comprising at least one asymmetric spring, at least one nonlinear spring, at least one magnet, and a coil, wherein the coil is wrapped around a nonmagnetic structure, wherein the at least one asymmetric spring connects the coil-wrapped nonmagnetic structure to a first wall of the generation unit and responds to radial direction acceleration (r) of the coil-wrapped nonmagnetic structure within the generation unit, wherein the at least one nonlinear spring connects the coil-wrapped nonmagnetic structure to a second wall of the generation unit and is aligned so that the coil-wrapped nonmagnetic structure transverses along a tangential direction ($\theta$) within the generation unit, wherein the coil-wrapped nonmagnetic structure is supported within the generation unit by the at least one asymmetric spring and the at least one nonlinear spring, wherein the at least one magnet is positioned around the generation unit, wherein asymmetry of the at least one asymmetric spring is realized by (a) the generation unit having the first and second walls approximately 90° relative to one another or (b) the at least one asymmetric spring having a different spring constant than other springs in the generation unit, and wherein the generation unit is placed in or on a rotating object and when there is a change of tangential acceleration, inertial force acting on a center of gravity of the coil-wrapped nonmagnetic structure and a reaction force on the at least one asymmetric spring produces torque and triggers snapping behavior of the nonlinear spring.

11. The generation unit of claim 10, wherein the rotating object is a wind turbine blade.

12. The generation unit of claim 10, wherein the generation unit is connected to a power management circuit and storage unit.

13. The generation unit of claim 10, wherein the generation unit is connected to an electrical application which requires electrical power.

14. The generation unit of claim 13, wherein the electrical application is a sensor.

15. The generation unit of claim 10, wherein the at least one nonlinear spring is a leaf spring.

16. The generation unit of claim 10, wherein the triggered snapping behavior triggers high-energy vibration of the coil-wrapped nonmagnetic structure.

17. The generation unit of claim 16, wherein the high-energy vibration is broadband frequency vibration.

18. A method of generating sustainable electrical energy, said method comprising harvesting the energy from a rotating object and converting it to electrical energy, said method comprising positioning the electromagnetic energy generation unit of claim 10 in or on a rotating object, and connecting the electromagnetic energy generation unit to a power management circuit and a storage unit, wherein the vibrational/kinematic energy of the rotating object is converted to sustainable battery-free electrical energy.

* * * * *